United States Patent [19]
Shimizu

[11] Patent Number: 5,706,302
[45] Date of Patent: Jan. 6, 1998

[54] TEMPERATURE CONTROL TYPE SEMICONDUCTOR LASER DEVICE

[75] Inventor: Haruhito Shimizu, Tokyo, Japan

[73] Assignee: NEC Corporation, Tokyo, Japan

[21] Appl. No.: 616,051

[22] Filed: Mar. 14, 1996

[30] Foreign Application Priority Data

Mar. 14, 1995 [JP] Japan ................. 7-054004

[51] Int. Cl.⁶ ........................... H01S 3/045
[52] U.S. Cl. ........................... 372/36; 372/34
[58] Field of Search ........................... 372/34, 36

[56] References Cited

U.S. PATENT DOCUMENTS

| | | | |
|---|---|---|---|
| 4,615,031 | 9/1986 | Eales et al. | 372/36 |
| 5,033,052 | 7/1991 | Masuko et al. | 372/36 |
| 5,212,699 | 5/1993 | Masuko et al. | 372/34 |
| 5,233,622 | 8/1993 | Iwamoto | 372/34 |
| 5,341,388 | 8/1994 | Masuda et al. | 372/34 |

FOREIGN PATENT DOCUMENTS 266987  3/1990  Japan .

OTHER PUBLICATIONS

Proceedings of the 1993 Autumn Conference of the Institute of Electronics, Information and Communication Engineers, C-180; pp. 4-260. (no month).

*Primary Examiner*—James W. Davie
*Attorney, Agent, or Firm*—Whitham, Curtis, Whitham & McGinn

[57] ABSTRACT

A Peltier cooler includes a plurality of Peltier elements, first and second ceramic substrates that are disposed to hold the Peltier elements through metallized electrodes formed inside the ceramic substrates and to electrically connect the Peltier elements in series, and first and second metal substrates respectively fixed to the first and second ceramic substrates by brazing, so as to hold them. The metal substrates are fixable to a substrate on which optical components are mounted and a semiconductor laser package, by yttrium-aluminum-garnet (YAG) laser welding. The YAG laser welding and the brazing operation eliminate the use of low-temperature solder, where creeps may occur.

16 Claims, 4 Drawing Sheets

TEMPERATURE CONTROL TYPE SEMICONDUCTOR LASER DEVICE

BACKGROUND OF THE INVENTION

1. Field of the Invention

The present invention relates to the structure of a semiconductor laser device and, more specifically, to a semiconductor laser device incorporating an electronic cooling device such as a Peltier cooler.

2. Description of the Related Art

The optical output and the oscillation wavelength of a semiconductor laser vary depending on its temperature. To stabilize the optical output and the oscillation wavelength, a semiconductor laser needs to be subjected to temperature control. A Peltier cooler is used to keep the temperature of a semiconductor laser constant. For example, it is used as an electronic cooling device in a semiconductor laser device as a modulation signal light source of an optical fiber transmission system.

An example of using a Peltier cooler in a semiconductor laser device is disclosed in Proceedings of the 1993 Autumn Conference of the Institute of Electronics, Information and Communication Engineers, C-180. In this type of device, a Peltier cooler is fixed, by soldering, to the bottom inside surface of a box-shaped package. A substrate on which a semiconductor laser is mounted is fixed to its top surface by soldering. A first lens is disposed on the light emission side of the semiconductor laser. A second lens is attached to the outside of the package by means of a cylindrical member so as to be disposed on an extension of the optical axis of the first lens. One end portion of a fiber is inserted along the above optical axis into a lid portion of the cylindrical member.

In the semiconductor laser device having the above structure, laser light emitted from the semiconductor laser is converted into collimated light by the first lens, then focused by the second lens, and finally coupled to the fiber. The first and second lenses and the fiber are fixed after their positional relationship is adjusted so as to provide a maximum coupling efficiency between the semiconductor laser and the fiber.

Usually, a Peltier cooler is fixed by soldering. Specifically, in a Peltier cooler, high-temperature solder is used to fix Peltier elements to substrates located on both sides. On the other hand, low-temperature solder is used to fix the Peltier cooler to the package and the substrate on which the semiconductor laser is mounted.

Creeping is liable to occur in solder, particularly in low-temperature solder. Creeping is a phenomenon that a portion continuously receiving a static, relatively small stress over a long time is deformed. Residual stress at the time of assembling and thermal stress exist in the inside of the semiconductor laser package. Therefore, in the conventional semiconductor laser device using a Peltier cooler, creeping is liable to occur at the fixing portions where low-temperature solder is used, making it difficult to keep the optical system in the optimum state for a long time.

Japanese Unexamined Patent Publication No. Hei. 2-66987 discloses a structure in which a cooling device is disposed in a semiconductor laser package. This publication also discloses a structure in which a cylindrical unit that is free of an optical axis displacement even with an external temperature variation is fixed to the cooling device by soldering. Main components of an optical device are disposed in the cylindrical unit. As a result, an optical axis displacement over time can be suppressed.

However, in the above structures, the main components of the optical device, such as the semiconductor laser and the lenses, are disposed in the special cylindrical unit, which is in turn accommodated in the semiconductor laser package. Therefore, the semiconductor laser device is complex in structure and costly. Since the main optical components are disposed in the cylindrical unit, there are limitations on the size and shape of the optical components. Thus, the degree of freedom of the component selection is low, which also makes it difficult to reduce the cost.

SUMMARY OF THE INVENTION

An object of the present invention is to provide a temperature control type semiconductor laser device which is simple in structure and can stabilize the optical system for a long time to increase its reliability.

A temperature control type semiconductor laser device according to the invention comprises an electronic temperature control device which comprises temperature control elements for performing temperature control based on a control signal that is externally supplied at electrodes thereof; ceramic substrates for vertically holding the temperature control elements from outside; and metal substrates fixed to the ceramic substrates by brazing. The electronic temperature control device is fixed to a bottom portion of a package by welding. Further, a substrate on which a semiconductor laser is mounted is fixed to the electronic temperature control device from above by welding. The semiconductor laser is subjected to the temperature control by the electronic temperature control device.

A specific example of the temperature control element is a Peltier element. The ceramic substrates are AlN (aluminum nitride) substrates or $Al_2O_3$ (aluminum oxide) substrates. The Peltier elements are arranged in matrix form and held by the ceramic substrates vertically from outside. Metallized electrodes are formed inside the ceramic substrates. The Peltier elements are fixed to the electrodes with SnSb solder. In this embodiment, a plurality of Peltier elements are electrically connected to each other in series and arranged in line.

The metal substrates include welding portions that are thinner than the other portion. The metal substrates are FeNiCo alloy substrates or SUS304 substrates. The ceramic substrates and the metal substrates are fixed to each other by AgCu brazing.

The temperature control type semiconductor laser device further comprises an optical fiber for leading out light that is emitted from the semiconductor laser.

In the temperature control type semiconductor laser device according to the invention, a plurality of Peltier elements are interposed between the first and second ceramic substrates through the metallized electrode from outside. These elements are fixed to the ceramic substrates using high-temperature solder. One of the metal substrates that are fixed, from outside, to the first and second ceramic substrates by brazing is fixed to the bottom portion of the package by welding The other of the metal substrates is fixed with the substrate on which the semiconductor laser is mounted by welding. Therefore, unlike the conventional cases, neither fixing with low-temperature solder nor incorporation of optical components within a special cylindrical unit is necessary. As a result, deteriorations in optical characteristics due to an optical axis displacement that would otherwise be caused by creeps in solder can be avoided even with a simple structure.

BRIEF DESCRIPTION OF THE DRAWINGS

The above and other objects, features and advantages of the present invention will become more apparent from the following detailed description when taken in conjunction with the accompanying drawings wherein.

DETAILED DESCRIPTION OF THE PREFERRED EMBODIMENTS

First, to facilitate understanding of the present invention, the structure of a conventional temperature control type semiconductor laser device will be described before a description of the structure of a temperature control type semiconductor laser device according to the invention.

Figure 1:
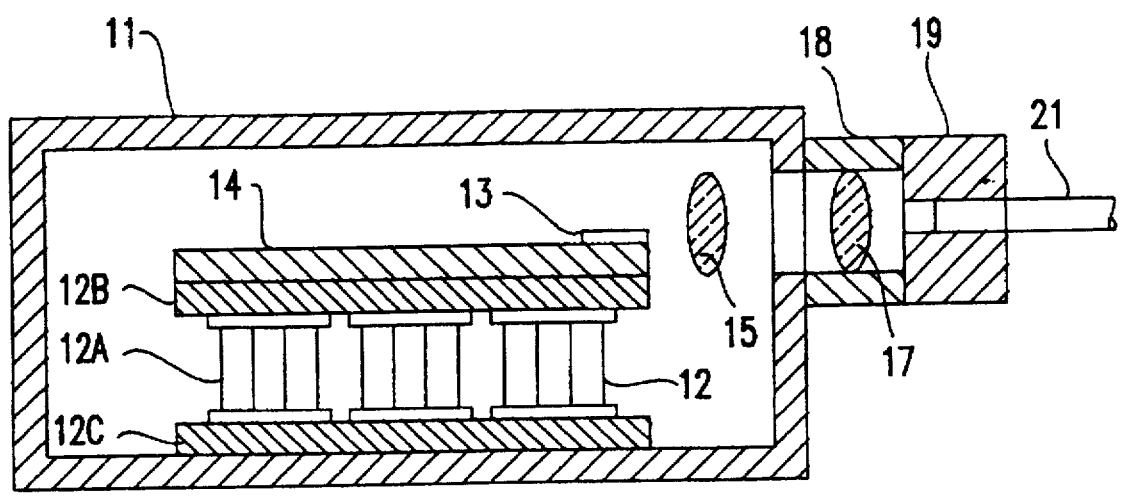
FIG. 1 shows an example of a conventional temperature control type semiconductor laser device.

FIG. 1 is a vertical sectional view showing the configuration of a conventional, temperature control type semiconductor laser device. A Peltier cooler 12 is fixed, by soldering, to the bottom inside surface of a box-shaped package 11. A substrate 14 on which a semiconductor laser 13 is mounted is fixed to the top surface of the Peltier cooler 12 also by soldering. A first lens 15 is disposed on the light emission side of the semiconductor laser 13. A second lens 17 is attached to the outside of the package 11 by means of a cylindrical member 18 so as to be disposed on an extension of the optical axis of the first lens 15. One end portion of a fiber 21 is inserted along the above optical axis into a lid portion 19 of the cylindrical member 18.

Laser light emitted from the semiconductor laser 13 is converted into collimated light by the first lens 15, then focused by the second lens 17, and finally coupled to the fiber 21. The first and second lenses 15 and 17 and the fiber 21 are fixed after their positional relationship is adjusted so as to provide a maximum coupling efficiency between the semiconductor laser 13 and the fiber 21.

The Peltier cooler 12 is fixed by soldering. Specifically, high-temperature solder is used to fix Peltier elements 12A to substrates 12B and 12C located on both sides. On the other hand, low-temperature solder is used to connect the substrates 12B and 12C to the substrate 14 on which the semiconductor laser 13 is mounted and the package respectively.

Creeping is liable to occur particularly in low-temperature solder. Residual stress at the time of assembling and thermal stress exist in the inside of the semiconductor laser package 11. Therefore, in the conventional semiconductor laser device using a Peltier cooler, creeping is liable to occur at the fixing portions where low-temperature solder is used, making it difficult to keep the optical system in the optimum state for a long time.

On the other hand, a structure in which a cooling device is disposed within a semiconductor laser package and a cylindrical units is fixed to the cooling device by soldering is complex and costly.

A temperature control type semiconductor laser device according to an embodiment of the invention will be hereinafter described in detail with reference to the drawings.

Figure 2:
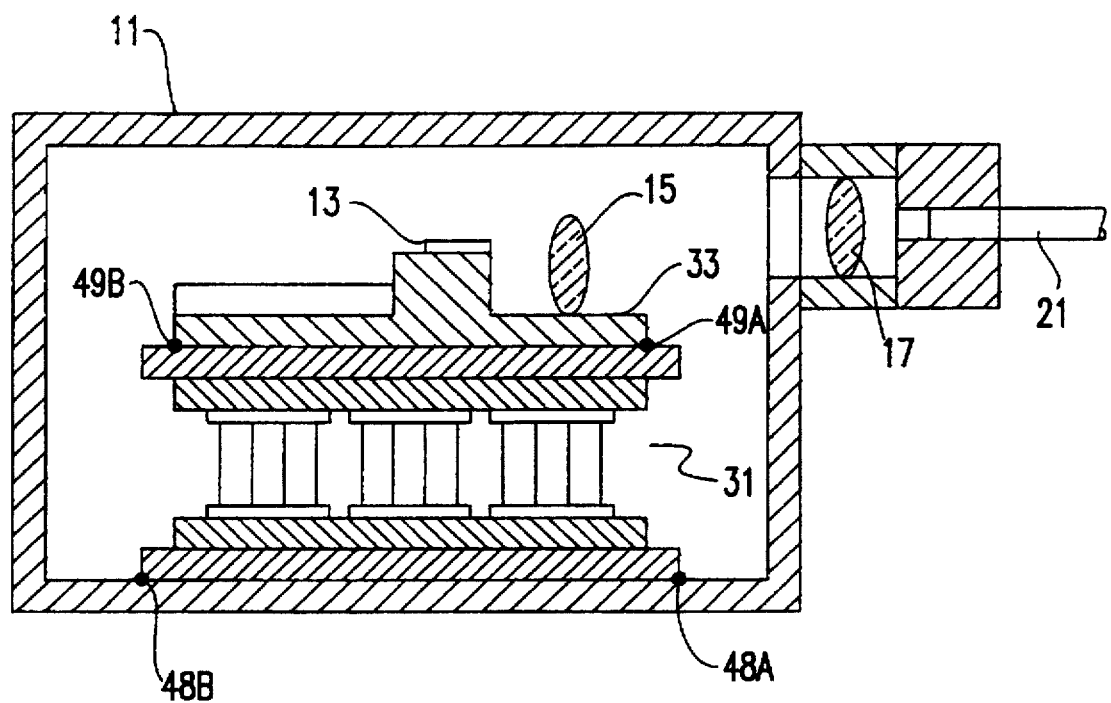
FIG. 2 shows the structure of a semiconductor laser device according to an embodiment of the invention.

FIG. 2 shows the structure of a temperature control type semiconductor laser device according to the embodiment of the invention. In this embodiment, a Peltier cooler is used as an electronic cooling device. In FIG. 2, the same components as in FIG. 1 are given the same reference symbols.

A Peltier cooler 31 of this embodiment is disposed on the bottom inside surface of a semiconductor laser package 11. A substrate 33 on which prescribed components such as a semiconductor laser 13 and a first lens 15 are mounted is placed on the Peltier cooler 31.

Also in this embodiment, laser light emitted from the semiconductor laser 13 is converted into collimated light by the first tens 15, then focused by the second lens 17, and finally coupled to a fiber 21. The first and second lenses 15 and 17 and the fiber 21 are fixed after their positional relationship is adjusted so as to provide a maximum coupling efficiency between the semiconductor laser 13 and the fiber 21.

A current is supplied to flow through the Peltier cooler 31 in accordance with a temperature detected by a temperature detecting element (not shown) such as a thermistor. Based on this control current, temperature control is performed so as to keep the temperature of the semiconductor laser 13 approximately constant independently of a variation of the ambient temperature.

Figure 3:
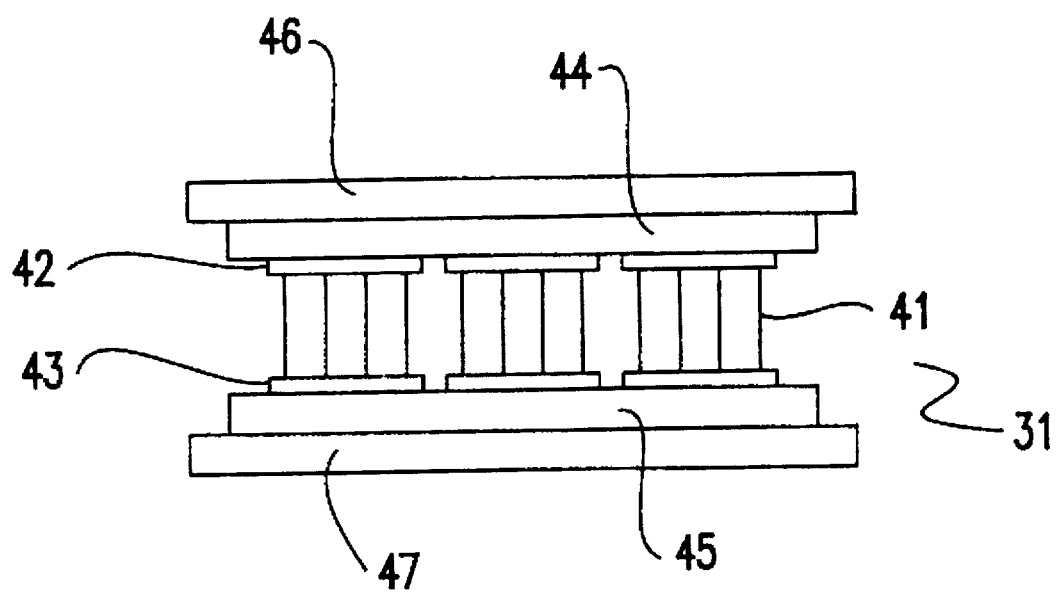
FIG. 3 shows the structure of a Peltier cooler incorporated in the semiconductor laser device of FIG. 2.

FIG. 3 shows the structure of the Peltier cooler 31 according to this embodiment. The Peltier cooler 31 has Peltier elements 41, first and second AlN substrates 44 and 45, on which metallized electrodes 42 and 43 are formed adjacent to the top and bottom faces of each Peltier element 41. The Peltier elements 41 are vertically interposed between the first and second AlN substrates 44 and 45 through the metallized electrodes 42 and 43. The Peltier cooler 31 further has first and second FeNiCo substrates 46 and 47 between which the above members are vertically interposed.

The Peltier elements 41 are fixed to the metallized electrodes 42 and 43 with SnSb solder (high-temperature solder), so that they are electrically connected to each other in series. Creeping is less liable to occur in SnSb solder. Lead wires (not shown) are connected to the respective series-connected Peltier elements, to externally supply a current to the Peltier elements 41.

The first AlN substrate 44 and the first FeNiCo substrate 46 disposed above it are bonded to each other by AgCu brazing. Similarly, the second AlN substrate 45 and the second FeNiCo substrate 47 disposed below it is bonded to each other by AgCu brazing.

As shown in FIG. 2, the second FeNiCo substrate 47 of the Peltier cooler 31 is fixed to the bottom inside surface of the semiconductor laser package 11 by YAG (yttrium-aluminum-garnet) laser welding at first bonding portions 48A and 48B. In FIG. 2, the substrate 33, which is placed on the Peltier cooler 31 is made of a FeNiCo-based material is fixed to the first FeNiCo substrate 46 by YAG laser welding at second bonding portions 49A and 49B.

In the semiconductor laser device using the Peltier cooler 31 of this embodiment, the fixing portions of the optical system, which were fixed with low-temperature solder conventionally, can now be fixed by brazing or YAG laser welding. Therefore, creeps in the optical system are extremely small, so that the optical system can be positioned stably for a long time.

While in this embodiment the Peltier elements 41 are interposed between the first and second AlN substrates 44 and 45, the latter may be replaced by substrates of other kinds of ceramics such as $Al_2O_3$. While in this embodiment the Peltier elements 41 and the metallized electrodes 42 and 43 are fixed to each other with SnSb solder, they may be fixed to each other with high-temperature solder with small creeps, such as SnAg solder.

Further, while in this embodiment the first and second FeNiCo substrates 46 and 47 are used as metal plates that are bonded to the first and second AlN substrates 44 and 45 (ceramic substrates), plates of other kinds of metal may be used as long as they are suitable for YAG laser welding. For example, alloys such as SUS304 may be used. Further, while in this embodiment the first and second AlN substrates 44 and 45 are respectively bonded to the first and second FeNiCo substrates 46 and 47 by AgCu brazing, the brazing material for bonding together the ceramic substrates and the metal substrates is not limited to AgCu, but may be AuGe, for instance.

Figure 4A:
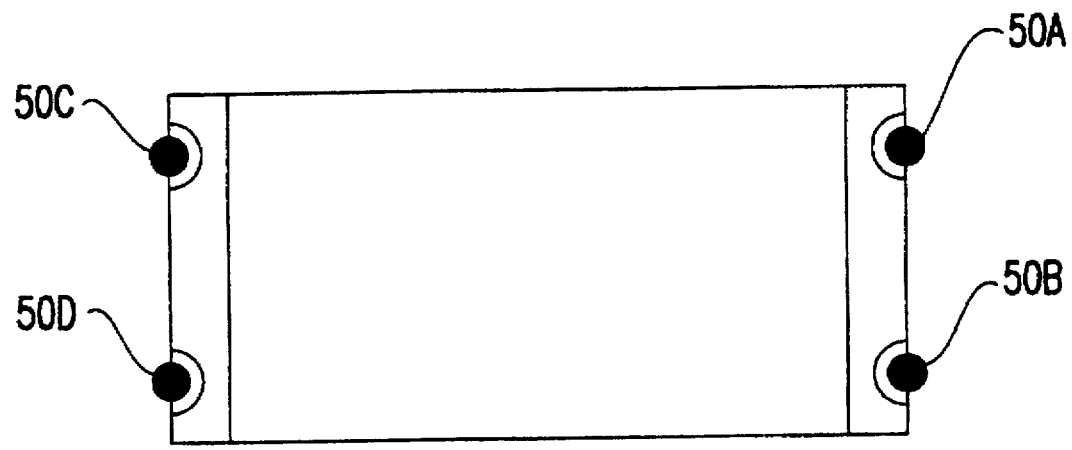
FIGS. 4(A) and 4(B) show the structure of a Peltier cooler according to a second embodiment of the invention.
Figure 4B:
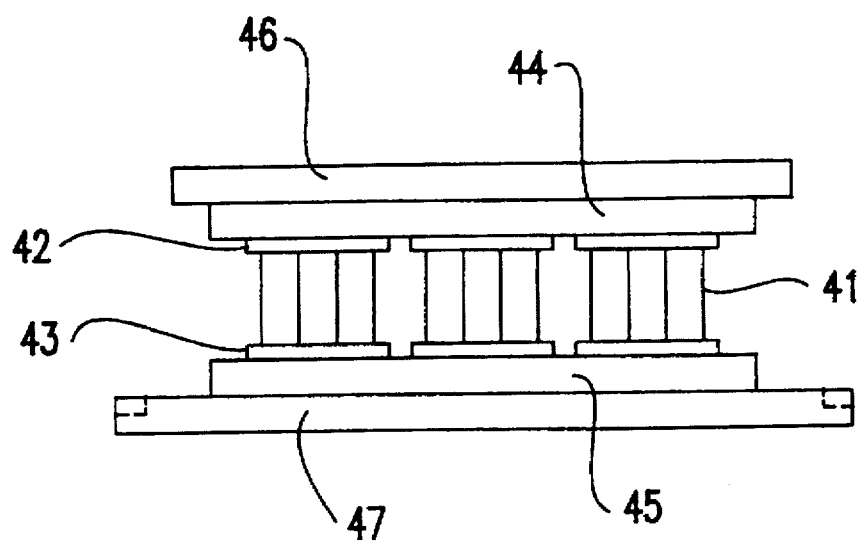

FIGS. 4(A) and 4(B) show the structure of a Peltier cooler according to a second embodiment, which is different from that of the first embodiment in that end portions of the FeNiCo substrate 47 are partially thinned in semicircular form.

In fixing the Peltier cooler 31 of FIG. 3 to the package 11 at the portions 48A and 48B by YAG laser welding, a YAG laser beam is applied to those portions in a direction inclined from the vertical direction. To this end, the dimensions of the package 11 should have some margins.

In contrast, with the Peltier cooler of this embodiment, YAG laser welding portions 50A-50D are formed with a YAG laser beam applied vertically. Therefore, it is not necessary for the dimensions of the package 11 to have any margins.

As described above, in the temperature control type semiconductor laser device according to the invention, a plurality of Peltier elements are interposed between the first and second ceramic substrates and bonded thereto with high-temperature solder. The first and second ceramic substrates are interposed between and respectively bonded to the first and second metal substrates by brazing. The first and second metal substrates allow YAG laser welding. Therefore, unlike the conventional cases, neither fixing with low-temperature solder nor incorporation of the optical components within a special cylindrical unit is necessary. Further, the invention enables stabilization of optical characteristics even with a simple structure.

Further, the first metal substrate is fixed, by YAG laser welding, with the optical component substrate on which the optical components are mounted, and the second metal substrate is fixed to the bottom inside surface of the package by YAG laser welding. Therefore, unlike the conventional case, it is not necessary to incorporate the optical components within a special cylindrical unit. Thus, the invention can reduce the cost as well as provide an optical system that is stable for a long time.

While this invention has been described in connection with certain preferred embodiments, it is to be understood that the subject matter encompassed byway of this invention is not to be limited to those specific embodiments. On the contrary, it is intended for the subject matter of the invention to include all alternative, modification and equivalents as can be included within the spirit and scope of the following claims.

What is claimed is:

1. A temperature control semiconductor laser device comprising:

electronic temperature control means comprising:

a temperature control element for performing temperature control based on a control signal that is externally supplied at electrodes thereof;

holding means for holding the temperature control element; and fixing means, coupled to the holding means by brazing, for fixing said holding means;

a package having a bottom portion to which welding portions of the fixing means are fixed by welding; and a semiconductor laser that is subjected to the temperature control by the electronic temperature control means.

2. The temperature control semiconductor laser device according to claim 1, wherein the semiconductor laser is placed on a mounting substrate that is welded to part of the fixing means.

3. The temperature control semiconductor laser device according to claim 2, wherein the temperature control element comprises a Peltier element.

4. The temperature control semiconductor laser device according to claim 3, wherein the temperature control element comprises a plurality of Peltier elements electrically connected to each other in series and arranged in matrix form.

5. The temperature control semiconductor laser device according to claim 4, wherein the holding means comprises first and second ceramic substrates respectively disposed a first and second ends of the temperature control element.

6. The temperature control semiconductor laser device according to claim 5, wherein the ceramic substrates include AlN substrates.

7. The temperature control semiconductor laser device according to claim 5, wherein the ceramic substrates include $Al_2O_3$ substrates.

8. The temperature control semiconductor laser device according to claim 5, wherein the fixing means comprises a plurality of metal substrates.

9. The temperature control semiconductor laser device according to claim 8, wherein the plurality of metal substrates include the welding portions that are thinner than the other portions.

10. The temperature control semiconductor laser device according to claim 8, wherein the plurality of metal substrates include FeNiCo alloy substrates.

11. The temperature control semiconductor laser device according to claim 8, wherein the plurality of metal substrates include SUS304 substrates.

12. The temperature control semiconductor laser device according to claim 5, wherein the holding means is connected with SnSb solder.

13. The temperature control semiconductor laser device according to claim 5, wherein the holding means is connected with SnAg solder.

14. The temperature control semiconductor laser device according to claim 8, wherein the brazing for fixing the holding means to the fixing means includes AgCu brazing.

15. The temperature control semiconductor laser device according to claim 8, wherein the brazing for fixing the holding means to the fixing means includes AgGe brazing.

16. The temperature control semiconductor laser device according to claim 2, further comprising an optical fiber for leading out light that is emitted from the semiconductor laser.

* * * * *